SEMICONDUCTOR DEVICE WITH PASSIVATED JUNCTION

Original Filed June 6, 1963 2 Sheets-Sheet 1

INVENTORS
Ki Dong Kang
Ezra David Metz
BY
Mueller & Aichele
ATTY'S.

INVENTORS
Ki Dong Kang
Ezra David Metz
BY
Mueller & Aichele
ATTYS.

3,302,076
Patented Jan. 31, 1967

3,302,076

SEMICONDUCTOR DEVICE WITH PASSIVATED JUNCTION

Ki Dong Kang and Ezra David Metz, Phoenix, Ariz., assignors to Motorola, Inc., Chicago, Ill., a corporation of Illinois Continuation of application Ser. No. 286,072, June 6, 1963. This application Sept. 28, 1966, Ser. No. 582,760
11 Claims. (Cl. 317—234)

This application is a continuation of Serial No. 286,072, filed June 6, 1963, now abandoned.

This invention relates to semiconductor devices and particularly to an improved design for passivated diodes and transistors whereby the electrode configuration for contacting the various conductivity regions of such devices acts to improve their surface states.

Surface states due to charged or polar species of contamination on semiconductor devices which have been treated to form a protective or "passivating" oxide film over critical surfaces have considerable effect on the electrical characteristics of the devices. Under the influence of strong fringing electrical fields at the surface portions of device PN junctions, such species of contamination tend to distribute on the surface of the oxide so as to alter the resistivity and nature of the semiconductor material regions near the oxide-semiconductor interface and especially adjacent to the junctions. Such changes may cause a reduction in avalanche breakdown or an increase in leakage current. For transistors, in certain applications these changes may also be accompanied by a reduction in current gain.

An ordinary oxide passivated silicon planar junction device with substantial reverse bias applied at a moderate junction temperature such as 25° C. to 50° C. may appear to be quite stable. However, its characteristics may vary as a result of past and present operating environments. The strong electric field across the PN junction has a fringing region at the surface which extends through the silicon dioxide film covering the junction. Initially polar and ionic species of contamination lie in a layer which is more or less uniformly distributed across the silicon dioxide. The contaminants, especially the ionic species, are attracted by the field but are relatively immobile at moderate temperatures so that any alteration in the distribution of the contaminants is extremely slow. However, at an elevated temperature, the mobility of the ionic species increases greatly and since the junction is reverse biased, the negatively charged contaminants tend to migrate across the oxide film to the region on top of the N type material and the positively charged contamination tends to move to the region over the P type material. When the bias is removed, the repulsive and attractive forces among the charged contaminants will ultimately return them to their initial distribution unless their mobility is reduced by cooling the device. The contamination which accumulates is particularly dense near the junction as would be expected since the fringing field is strongest there. In low resistivity material the net effect of this accumulated charge on the underlying silicon may not be too great but moderate to high resistivity material will undergo considerable alteration of resistivity near the surface due to charges which are attracted in the silicon toward the oxide-silicon interface by the ions. The formation and variation of these charged regions, i.e., accumulation layers or inversion layers (channels), cause changes and fluctuations in the avalanche breakdown voltage, the reverse leakage currents and the surface recombination velocity.

The effect of the accumulated charge due to ions could be compensated for if the bias were to remain constant or if the device were to be always operated at low temperatures. However, this is not the case in normal operation.

In normal operation the following may occur. If the contamination is accumulated at a high reverse bias, it tends to pile near the extremes of the width of the surface portion of the depletion region and therefore in high resistivity silicon channels due to the contamination also begin near such a extreme. Then at low temperatures at low bias voltages, where the depletion region does not contact a channel, the device may appear satisfactory. However, when the voltage is increased and the depletion region thickens until it contacts a channel, the reverse current across the junction suddenly increases due to increased surface recombination velocity and leakage due to the channel. If the device is operated at reduced bias at high temperature the contamination redistributes closer to the chemically determined junction and then if the device is again operated at low temperature as before, the bias voltage where the reverse current suddenly increases will occur at a lower value. This type of phenomena is quite objectionable as it is very difficult to predict the behavior of a device in which it occurs.

While the polar species existing within the oxide and on its surface will migrate at relatively high temperatures under the influence of a non-uniform field, their mobility even on the surface of the oxide is sufficiently low that for short time intervals up to several hours, they may be considered as fixed. These polar species under low fields tend to orient on the average normally to the surface of the oxide, with the poles nearest the silicon tending to have the positive charge. The net effect of these polar species is to attract a significant amount of negative charge to the oxide-silicon interface; the resistivity of the silicon near the surface will then vary according to the distribution and degree of orientation of the polar species. As the bias increases the field increases and the dipoles tend to flatten as they orient along the lines of the field. As the dipoles become inclined away from normal, their attractive effect is less and the induced charge is reduced near the oxide-silicon interface. Thus, when the electric field is changing as with changing bias, resistivity sensitive parameters may also change which is undesirable. For example, at avalanche breakdown the charges in the field so alter the resistivity of the silicon near the surface of the junction so that the voltage at which it occurs may vary from a minimum value according to the states of the surface of the junction to a maximum value corresponding to the voltage at which bulk avalanche breakdown occurs. This is an especially troublesome characteristic of some types of NPN planar transistors and is known as "avalanche-walkout."

In the past, effort toward the reduction of the effect of polar and ionic species of contamination has been directed along two approaches: (1) their removal, and (2) their immobilization.

Removal of enough contamination to largely eliminate the effect on surfaces is extremely difficult to accomplish since very little contamination is necessary to seriously affect a surface, especially where the resistivity of the semiconductor material is rather high. Five ohm-centimeter N type silicon, for example, has approximately $10^{15}$ more donor impurity atoms than acceptor atoms per cubic centimeter which is equivalent to $10^{10}$ atoms per square centimeter of surface area. This surface may be rendered intrinsic (neutral) if an equal density of positive charge is induced at the surface. A monolayer of silicon of one square centimeter surface has approximately $1.2\times10^{15}$ atoms, so that if one assumes the same density of charge in a monolayer of contamination then less than $1/10,000$ of a monolayer of charged contamination is required to render one monolayer of five ohm-centimeter N type silicon intrinsic and slightly greater amounts would of course invert the material to high resistivity P type.

At present, non-destructive cleaning techniques do not approach the degree of cleanliness required.

Since polar and ionic species are mobile on moist surfaces, attempts at immobilization of the species included drying the surface of the oxide. This treatment provides a stable surface at low temperatures but at higher temperatures their mobility is increased and the charges are again more free to redistribute under the influence of the fringing field across the junction.

Since the tendency toward redistribution is greater with stronger fields, in order to reduce the field at the surface of the oxide film, thicker films and films having higher dielectric constants have been tried. In both cases, to effectively immobilize the contamination, the oxide films must be quite thick. When thick, the films either tend to devitrify and crack or tend to crack due to a mismatch between the semiconductor material and the oxide; in either case, strains are set up in the semiconductor material and the faulty oxide film is no longer a satisfactory dielectric so ultimately device degradation occurs.

Inasmuch as the charged or polar contaminants cannot accumulate or be redistributed in the absence of an electric field, it is evident then that elimination of the fringing electric field at the surface of the oxide would improve the stability of the semiconductor device.

Accordingly, an object of this invention is to improve the reliability of semiconductor devices by eliminating the fringing electric field across the surface of the oxide covering PN junctions.

It is a further object of this invention to improve the avalanche breakdown characteristics of PN junctions by the elimination of the fringing electric field across the surface.

A feature of this invention is the design of metallic contacts to semiconductor devices so that they provide both a field-free equipotential surface across the surface of the oxide film and a control over the distribution of charge in the nearby semiconductor material.

In accordance with this invention planar transistors and planar junction devices may be improved by preparing metal contacts or electrodes to form equipotential surfaces across critical surface regions so that channels and accumulation layers are interrupted and the net effect of the fringing electric field of a PN junction is minimized. The fringing field terminates on the equipotential surface and this effectively stabilizes the surface as a field cannot exist across an equipotential surface of the semiconductor device, and thereby the surface dependent electrical characteristics of the semiconductor device are stabilized.

The metal films are separated from the critical regions of the semiconductor surface by a film of dielectric material such as silicon dioxide and the metal film is formed so as to be electrically in contact with a region of the semiconductor material. The metal film is everywhere at the same potential as the semiconductor material to which it is in contact and this potential acts to control the density and distribution of electrical charge in the semiconductor material in the region near the film where it is separated from it by the dielectric. By connecting the metal film to a region of the semiconductor material so that a bias of a given polarity is applied to the metal, avalanche breakdown characteristics and the leakage currents may be improved in planar devices and in planar transistors the current gain may also be improved.

Using a planar transistor as an illustrative example, the following text with the accompanying drawings will show in a more detailed manner what the invention is and how it is utilized.

Figure 1:
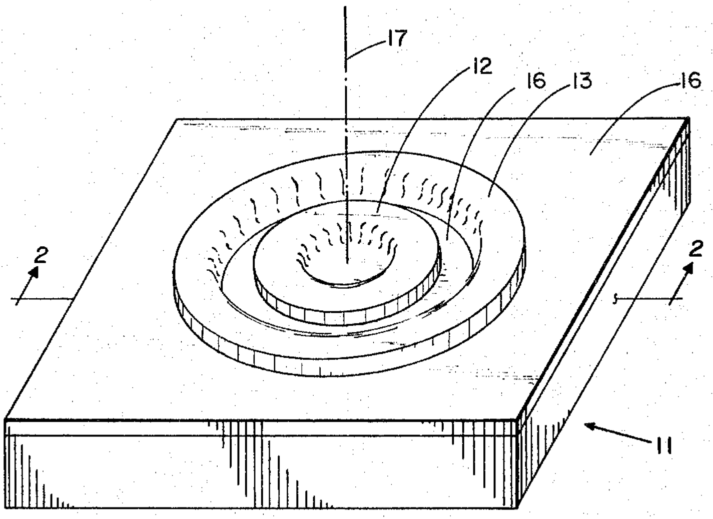
FIG. 1 is an isometric view of a transistor having metal emitter and base contact regions of a design to control surface states about the semiconductor junctions.

In FIG. 1, the active element 11 of a NPN planar silicon transistor is shown with two concentric metal electrodes or contacts 12 and 13 on the upper surface of the element. A film of silicon dioxide 16 covers a large portion of the silicon chip on which the complete active element is formed.

Figure 2:
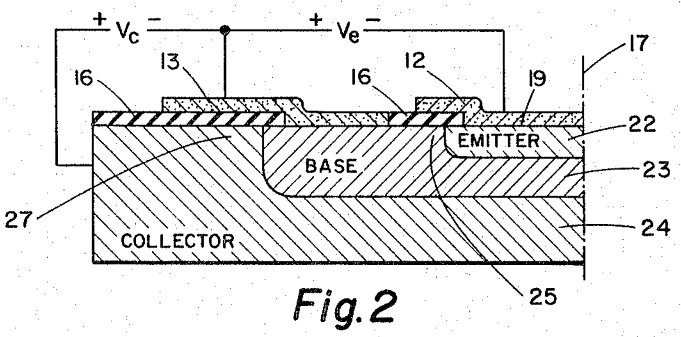
FIG. 2 is a portion of an enlarged sectional view of FIG. 1 taken at line 2—2 to show the relative placement of the metal regions on the semiconductor surface.

A section through FIG. 1 at line 2—2 is shown in FIG. 2. For clarity the sectional view is shown several times larger than FIG. 1 and since the structure is symmetrical about the centerline 17, only the left half of the section is shown. At the surface plane 19 of the silicon, where the junctions formed by the emitter 22 and base 23 and the collector 24 and base 23 terminate, the junction regions are covered with a film of silicon dioxide 16. This oxide film is partially covered with metal from the emitter and base contacts 12 and 13 respectively which are therefore also respectively at emitter and base potentials. The metal on the silicon dioxide covers the entire surface portions of the junctions.

Since the emitter 22 and emitter contact 12 is at negative potential $V_e$ with respect to the base 23, the portion of the emitter contact 12 which lies over the base induces positive charge in the base region 25 near the dielectric-silicon interface. As is known, the induction of appreciable positive charge in this region in P type base material (or negative charge in N type base material) results in general in an increase in low frequency current gain. This structure has a stabilizing or passivating effect on the structure since the metal provides an equipotential surface across the oxide covering the junction. However, since the field in the oxide over the more sensitive base region will vary according to the emitter bias, this does not give the greatest degree of stabilization.

The base 23 and its contact 13 are at a negative potential $V_c$ with respect to the collector 24 so that positive charge is attracted toward the surface in the collector region 27 near the junction. This increases the resistivity of this region 27 and therefore the voltage at which avalanche breakdown occurs at the surface. If the required voltage for surface avalanche breakdown is greater than for avalanche breakdown in the bulk, the junction will tend to break down in the bulk material. This is advantageous since bulk effects are generally more stable than surface effects.

Alternatively, if a collector electrode 29 (FIG. 3) rather than the base contact extends over the oxide 30 which covers the collector-base junction, and the base contact extends over the oxide which covers the emitter-base junction, then different effects occur. Since the potential of the metal film on top of the oxide must always be at the same potential as the silicon to which it is in connection, excess charge is unable to form at the dielectric-silicon interface near the film and a passivated surface results.

Figure 3:
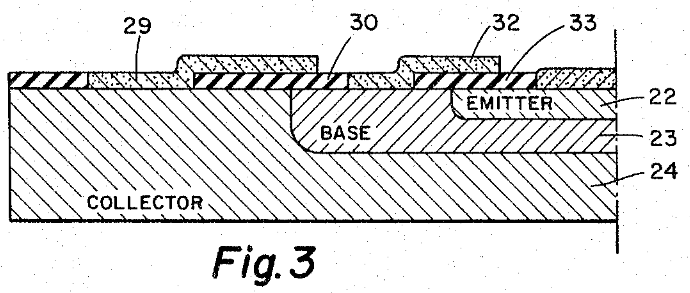
FIG. 3 is a portion of an enlarged sectional view of a transistor with base and collector electrodes designed to control surface states near the junctions.

When the collector electrode 29 is formed as shown in FIG. 3, the result is to prevent any channel formation in the collector due to ion migration, since ions cannot accumulate in the metal film as it is everywhere at the same potential. This is desirable, of course, since a channel in the collector region would be a region of high recombination and/or leakage and therefore significantly increase the reverse collector current of the device. Since higher resistivity material may be designed into the collector region without danger of channel formation, significant increases in avalanche breakdown may be obtained by forming the collector contact in this manner.

In NPN transistors, this collector structure (FIG. 3) largely eliminates the problem of "avalanche walkout" since the field across the surface of and through the oxide is now localized largely in the region through the oxide on the P type side of the junction; except for the junction region at the surface the field of the structure under bias may be likened to that of a parallel plate capacitor with the metal over the oxide covering the P region being one plate and the P region being the other. The direction of the total field across the plates becomes more vertical under increased bias since with the thickening of the junction depletion region at the surface, the field across the surface portion of the junction necessarily increase at a smaller rate than that part of the field across the "plates" since they are fixed by the thickness of the oxide. The metal collector contact is an equipotential region so there can be no field across the surface of the oxide and with the proportional reduction of the horizontal component of the fringing field those dipoles in the oxide which can flatten under its influence are much reduced in number, so that "avalanche walkout" is minimized and in fact largely eliminated as a transistor operating problem. Extending the base contact 32 over the oxide 33 covering the emitter-base junction as shown in FIG. 3 will lead to a slight reduction in low frequency current gain; however, this structure provides the greatest degree of stabilization with respect to those parameters related most closely to the emitter-base junction such as current gain. Excellent stabilization results since with the base region and the metal film at the same potential, the oxide on the base side of the junction is essentially field free and therefore insensitive to changes in bias. Thus varying surface states in the base due to changes in the nature and distribution of charge in overlying oxide cannot occur.

Silicon transistors which have been passivated as shown in FIG. 3 of this invention may be held at elevated tempreatures at biasing voltages up to avalanche for 1000 hours without significant change in gain, breakdown and leakage characteristics which is indicative of a high degree of surface stabilization.

Figure 4:
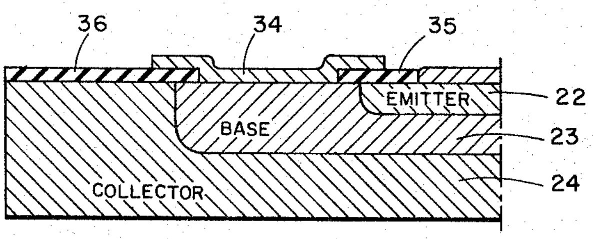
FIG. 4 is a portion of an enlarged sectional view of a transistor with a base electrode designed to control the surface states near the junctions.

The accompanying drawings have shown two ways of forming the metal electrodes on a transistor. Other ways are useful. For example, in FIG. 4 an electrode 34 may be formed which is in contact with the base semiconductor material and which extends over the portion of the oxide film 35 which covers the emitter-base junction and also the film 36 which covers the collector-base junction. Thus, the metal of a single electrode covers the entire surface portions of both junctions. This structure, of course, increases the avalanche breakdown voltage of the device and stabilizes the parameters which are closely related to the nature of the emitter-base junction.

Figure 5:
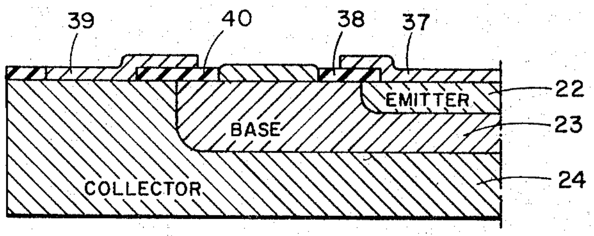
FIG. 5 is a portion of an enlarged sectional view of a transistor with emitter and collector electrodes designed to control surface states near the junctions.

A device (FIG. 5) featuring an increased current gain and a collector in which channels cannot form may be made by extending the emitter contact 37 over the oxide 38 on the edge of the emitter-base junction such that it entirely covers this junction-edge and by extending an electrode 39 in contact with the collector over the oxide 40 on the edge of the collector-base junction such that it entirely covers the latter junction.

The electrode structures which have been discussed in this specification have been of a type which covered all of the surface portion of the junction. It should be noted, however, that while some improvement may occur as a result of covering a part of the junction, the improvement will be found to be slight unless the junction is fully covered.

Figure 6:
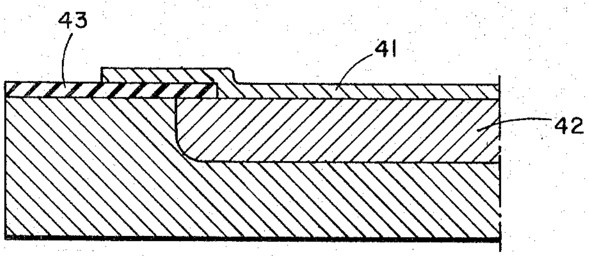
FIG. 6 is a portion of an enlarged sectional view of a diode with an electrode designed to control the surface states near the junction.

The contact or electrode structure is not limited to transistors but is applicable to other semiconductor devices such as diodes (FIG. 6) where altering the surface states can make useful changes in the characteristics of the device. For example, PN planar diodes (i.e., diodes in which the P region is more heavily doped than is the N region) having increased avalanche breakdown voltage may be prepared by forming the contact 41 to the P region 42 so that the metal extends over the oxide 43 covering the junction. On the other hand, forming a ring electrode in contact with the N region which extends over the oxide covering the junction results in a diode in which channels cannot form in the N region.

The devices which have been discussed have been NPN transistors and PN diodes. The principles involved are, of course, valid for PNP transistors and NP diodes as well, consistent with the application of the appropriate bias.

We claim:

1. In a semiconductor device including a semiconductor element having a first region and a second region of opposite conductivity types with the second region wholly within the first region, and a rectifying junction therebetween extending to and terminating at the top surface of the semiconductor element, the combination of an insulating coating on said top surface which can have contaminants therewith capable of inducing corresponding charge distributions in said two regions beneath said insulating coating, and means for diminishing the effect of any such charge distributions comprising conducting means in ohmic contact with the first region and extending upwardly to the top surface of said insulating coating and radially inwardly over said top surface of said insulating coating toward said second region, and also extending over an area at the top surface of the semiconductor element and the insulating coating which encircles said second region.

2. In the semiconductor element for a device as defined in claim 1, said conducting means being of such a dimension that it extends radially inwardly on said insulating coating and above the rectifying junction termination at the top surface of the semiconductor element.

3. In the semiconductor element for a device as defined in claim 1, having a third region wholly within said second region with a rectifying junction between said second and third regions, and with said conducting means extending on the top surface of said insulating coating toward said second and third regions.

4. In the semiconductor element for a device as defined in claim 1 with the conductivity type of said first region being N-type, and that of said second region being P-type.

5. In the semiconductor element for a device as defined in claim 1 with the conductivity type of said first region being P-type, and that of said second region being N-type.

6. In a semiconductor element for a device as defined in claim 1, having a third region wholly within said second region and a rectifying junction between said second and said third regions, and with said means for diminishing the effect of any such charge distributions comprising also a second conducting means in ohmic contact with said second region and extending upwardly to the top surface of said insulating coating and radially inwardly over said top surface of said insulating coating toward said third region, and also extending over an area at the top surface of the semiconductor element and the insulating coating which encircles said third region.

7. In a semiconductor device including a semiconductor element having a first region and a second region of opposite conductivity types with the second region wholly within the first region, and a rectifying junction therebetween extending to and terminating at the top surface of the semiconductor element, and a third region of opposite conductivity type to that of said second region and wholly within said second region the combination of an insulating coating on said top surface which can have contaminants therewith capable of inducing corresponding charge distributions in said regions beneath said insulating coating, and means for diminishing the effect of any such charge distributions comprising conducting means in ohmic contact with the second region and extending upwardly to the top surface of said insulating coating and radially outwardly over said top surface of said insulating coating toward said first region and away from second and third regions and also extending over an area at the top surface of the semiconductor element and the insulating coating which is encircled by said first region.

8. In the semiconductor element for a device as defined in claim 7, said conducting means being of such a dimension that it extends radially outwardly on said insulating coating and above said junction termination at the top surface of the semiconductor element.

9. In the semiconductor element for a device as defined in claim 7 with the conductivity type of said first region being N-type, that of said second region being P-type, and that of said third region being N-type.

10. In the semiconductor element for a device as defined in claim 7 with the conductivity type of said first region being P-type, that of said second region being N-type, and that of said third region being P-type.

11. In a semiconductor device including a semiconductor element having three regions with the first and third regions of one conductivity type and the second region of an opposite conductivity type to that of the other two regions, and a rectifying junction between the first and second regions and between the second and third regions with each junction extending to and terminating at the top surface of the semiconductor element, the combination of an insulating coating on said top surface which can have contaminants therewith capable of inducting corresponding charge distributions in the regions beneath said insulating coating, and means for diminishing the effect of any such charge distributions comprising conducting means in ohmic contact with the second region only and extending upwardly to the top surface of said insulating coating and at said top surface extending both radially inwardly and radially outwardly therefrom over said top surface of said insulating coating toward said third region and toward said first region respectively, and extending over an area at the top surface of the semiconductor element and the insulating coating which respectively encircles said third region and is encircled by said first region.

References Cited by the Examiner

UNITED STATES PATENTS

| | | | |
|---|---|---|---|
| 2,552,052 | 5/1951 | Matare | 217—236 |
| 2,898,477 | 8/1959 | Hoesterey | 717—235 |
| 2,981,877 | 4/1961 | Noyce | 317—235 |
| 3,045,129 | 7/1962 | Atalla et al. | 317—235 |
| 3,097,308 | 7/1963 | Wallmark | 317—235 |
| 3,184,657 | 5/1965 | Moore | 317—235 |
| 3,199,002 | 8/1965 | Martin | 317—235 |
| 3,204,160 | 8/1965 | Sah | 317—235 |

FOREIGN PATENTS

| | | |
|---|---|---|
| 1,361,215 | 3/1964 | France. |
| 1,008,415 | 5/1957 | Germany. |

OTHER REFERENCES

Journal of Applied Physics, "Effect of Variations in Surface Potential on Junction Characteristics" by Forster et al., June 1959, vol. 30 No. 6, pages 906–912.

JOHN W. HUCKERT, *Primary Examiner.*

J. D. CRAIG, *Assistant Examiner.*

UNITED STATES PATENT OFFICE

Certificate

Patent No. 3,302,076 Patented January 31, 1967

Ki Dong Kang and Ezra David Metz

Application having been made jointly by Ki Dong Kang and Ezra David Metz, the inventors named in the patent above identified, and Motorola, Inc., of Chicago, Illinois, a corporation of Illinois, the assignee, for the issuance of a certificate under the provisions of Title 35, Section 256 of the United States Code, deleting the name of the said Ki Dong Kang, from the patent as a joint inventor, and a showing and proof of facts satisfying the requirements of the said section having been submitted, it is this 7th day of January 1969, certified that the name of the said Ki Dong Kang, is hereby deleted from the said patent as a joint inventor with the said Ezra David Metz.

[SEAL]

EDWIN L. REYNOLDS,
*First Assistant Commissioner of Patents.*